United States Patent [19]

Eichenlaub

[11] Patent Number: 4,880,196
[45] Date of Patent: Nov. 14, 1989

[54] APPARATUS FOR MOUNTING MARINE ELECTRONIC EQUIPMENT

[76] Inventor: John E. Eichenlaub, 9426 Beverly La., Sanibel Island, Fla. 33957

[21] Appl. No.: 56,157

[22] Filed: Jun. 1, 1987

[51] Int. Cl.⁴ .............................................. E04G 3/00
[52] U.S. Cl. .................................... 248/293; 248/165
[58] Field of Search ...................... 248/293, 150, 188.6, 248/460, 165, 166; 211/26, 195

[56] References Cited

U.S. PATENT DOCUMENTS

| | | | |
|---|---|---|---|
| 610,656 | 9/1898 | Martin | 248/293 |
| 1,358,231 | 11/1920 | Milne | 248/293 |
| 2,550,019 | 4/1951 | Murphy | 248/311.2 |
| 2,828,098 | 3/1958 | Lehmann | 248/293 |
| 4,467,926 | 8/1984 | Percival | 211/94.5 |
| 4,605,193 | 8/1986 | Kuparinen | 248/166 X |
| 4,667,915 | 5/1987 | Boucher et al. | 248/293 |

Primary Examiner—Ramon O. Ramirez
Attorney, Agent, or Firm—Gifford, Groh, Sheridan, Sprinkle and Dolgorukov

[57] ABSTRACT

Supports for marine electronic equipment in accordance with the present invention include an open frame to which are fastened a pivotable back and linkage making it possible to mount the back to a bulkhead or transom in a water craft. Arms extending from the back carry the item or items of equipment and the arms fold against the back when the equipment is removed and the support is folded shut for storage.

Another form of portable support for marine electronic equipment in accordance with the invention includes an open rectangular frame with supports removably mounted to the frame, such supports being pivotable and adjustable on the frame.

11 Claims, 2 Drawing Sheets

APPARATUS FOR MOUNTING MARINE ELECTRONIC EQUIPMENT

BACKGROUND OF THE INVENTION

1. FIELD

The present invention relates generally to mounting devices and, more particularly, to an adjustable device for supporting and for carrying marine electronic equipment aboard a water craft. Such equipment, while supported by the apparatus of the present invention, may be used aboard a water craft, and it may be removed and carried therefrom when the water craft is not in use.

2. PRIOR ART

U.S. Pat. No. 2,550,019 to Murphy discloses a rack which may be suitably secured to a wall-like surface. Such a rack may be folded down to support a refuse receptacle or the like, and later which may be folded up against the wall-like surface when not in use supporting such receptacle.

SUMMARY OF THE INVENTION

In one embodiment of the present invention, a rectangular open frame is pivotably connected to a back structure. Both the frame and back structure are connected to linkage that connects to a handle for carrying the apparatus and marine electronic equipment installed thereon. The apparatus is collapsible for easy storage aboard a water craft or ashore.

In another embodiment of the invention, a rectangular open frame carries pivotable arms that support items of marine electronic equipment. The frame is mountable on a water craft when the equipment is in use and may be removed from the water craft and carried ashore.

The many objects and advantages of the present invention will become apparent to those skilled in the art when the following description of the best modes contemplated at present for practicing the invention are read in conjunction with the accompanying drawings, wherein like reference numerals refer to like or equivalent parts.

BRIEF DESCRIPTION OF THE DRAWING

In the drawings:

FIG. 7 is a view along line VII—VII of FIG. 2;

FIG. 7a is a view along line VIIa—VIIa of FIG. 7;

FIG. 7b is a view along line VIIb—VIIb of FIG. 7;

DETAILED DESCRIPTION

Many boats and various types of water craft (hereinafter boats) are equipped with costly electronic equipment such as radio-telephones, depth sounders, Loran devices, and the like that are useful when a boat is in service on bays, lakes and larger bodies of water to assist the owner or operator in finding locations and navigating generally.

Because such electronic equipment is so costly, and because boats are burglarized, and because such equipment can be damaged irreparably when struck by lightning, it is desirable to be able to remove such equipment after each use of the boat.

These marine equipment devices are usually attached to brackets mounted to a transom or bulkhead, or the like, by knurl-headed screws at or near the center of their sides, and such screws fit into slots of a support bracket fixed to the transom or bulkhead or the like.

An object of the present invention is to provide apparatus for supporting marine electronic equipment on a boat and for transporting such marine electronic equipment ashore and for stowing it ashore.

How my invention accomplishes this principal objective will be recognized by those skilled in the art from the description of a preferred embodiment of the invention with reference to the drawings.

Figure 1:
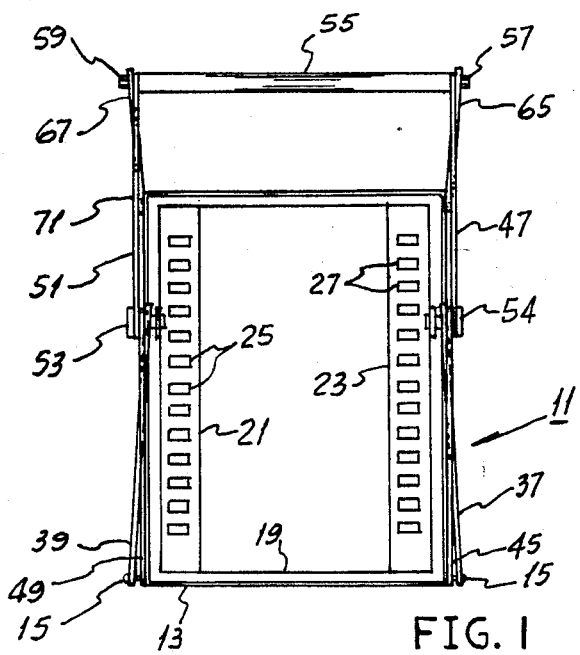
FIG. 1 is a schematic rear elevational view of a foldable apparatus for mounting marine electronic equipment in accordance with the present invention.

Referring to FIG. 1, an apparatus, or rack, 11 in accordance with the invention, for supporting marine electronic equipment aboard a water craft or boat and for transporting such equipment comprises an open frame 13 to which is hinged, as at 15, a back 17 comprising an open frame 19 with two panels 21,23 fixed to the open frame 19; each panel having a plurality of rectangular apertures 25,27. To the two panels 21,23, are adjustably mounted two equipment support arms 29,31 on each panel. The arms 29,31 have elongate slots 33,35 with open ends; shaped about as shown, that receive knurl-headed mounting screws (not shown) on an item of equipment. By threading the screws into each respective item of marine electronic equipment and sliding the screws into the slots 33,35, each item of marine electronic equipment is supported on the arms. The screws can be tightened to hold the item in place.

Figure 2:
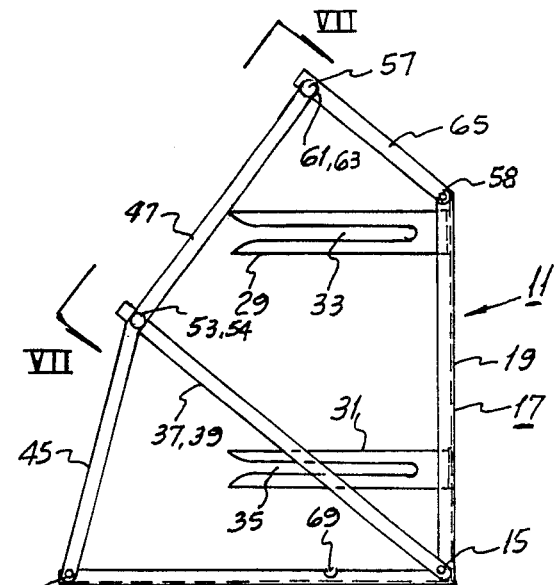
FIG. 2 is a side elevational view of the apparatus of FIG. 1.

Hinged to the open frame 13, and to the bottom of the back 17, are two elongate pivotable arms 37,39, one such arm being hinged on each side of the open frame 13. Each pivotable arm 37,39, at the outer end portion, is provided with a semi-circular notch 41 (see FIG. 7a) in the lower edge that coacts with an extended hinge pin 53 joining together two other pivotable arms 45,47. The arms 45,47 are pivoted to the open frame 13 about where shown in FIG. 2. Two other pivotable arms 49,51, like arms 45,47, are pivotably connected together by a hinge pin 53, like hinge pin 43. The hinge pin 53 receives a semi-circular notch in the elongate pivotable arm 39. Each one of the arms 47,51 is connected, respectively, to opposite ends of an elongate handle 55 by means of extended pins 57,59 that are threaded into the handle 55, as shown in FIG. 7.

The extended pins 57,59 receive notches 61,63 in arms 65,67 that are pivotably mounted to the top of the back 17, on opposite sides thereof, as at 69,71.

Figure 3:
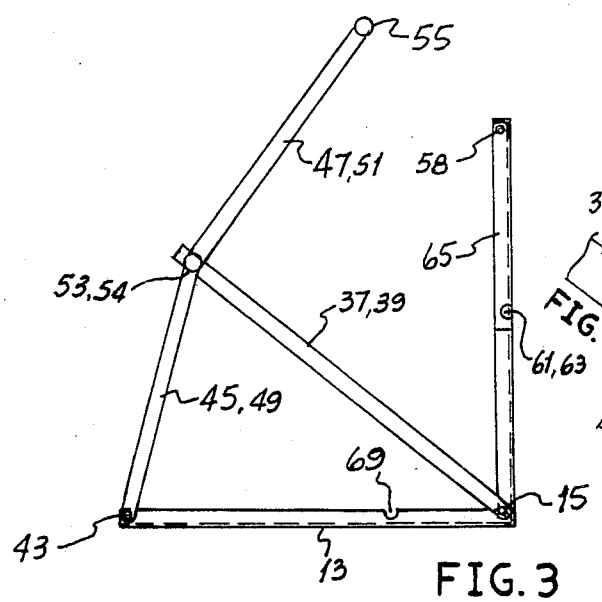
FIG. 3 is a view of the apparatus of FIGS. 1 and 2 partially folded.
Figure 4:
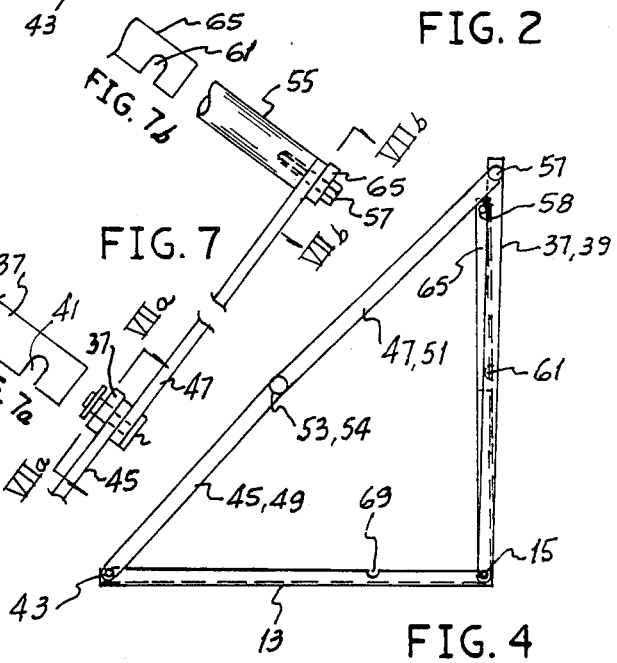
FIG. 4 is a view of the apparatus of FIG. 3 showing it nearly folded.
Figure 5:
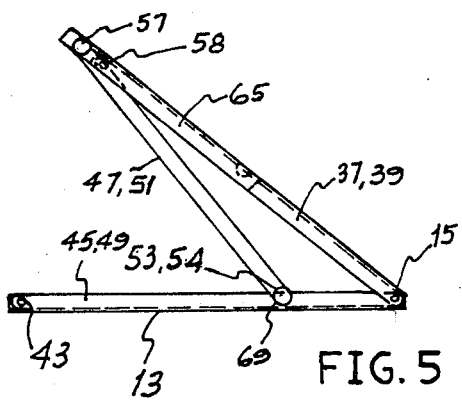
FIG. 5 is a view of the apparatus of FIG. 4 showing it almost folded.
Figure 6:
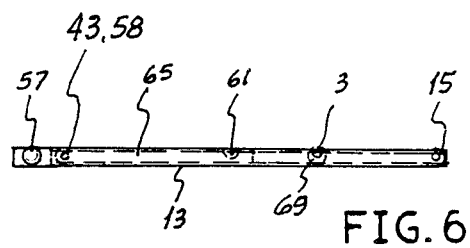
FIG. 6 is a view of the apparatus of FIGS. 1-4 showing it completely folded.

Referring to FIG. 3, the arms of 65,67 have been detached from the handle and depend from the pivot pin 57. Referring to FIG. 4, the elongate arms 37,39 pivot upward about pivot pins 15, and the handle 55 is connected to the arms 37,39 when the notches 41 therein coact with the pins 57,59 of the handle 55. Thereafter, the arms 65,67 and the arms 37,39 pivot about the pins 15 while the arms 45,47, and the arms 49,51, pivoting about pins 43, fold inward so that a notch 69 in the shelf receives the pin 43, as shown in FIG. 5. By continuing to fold the assembly downward as in FIG. 5, the entire unit structure is flat and compact, as shown in FIG. 6.

Figure 8:
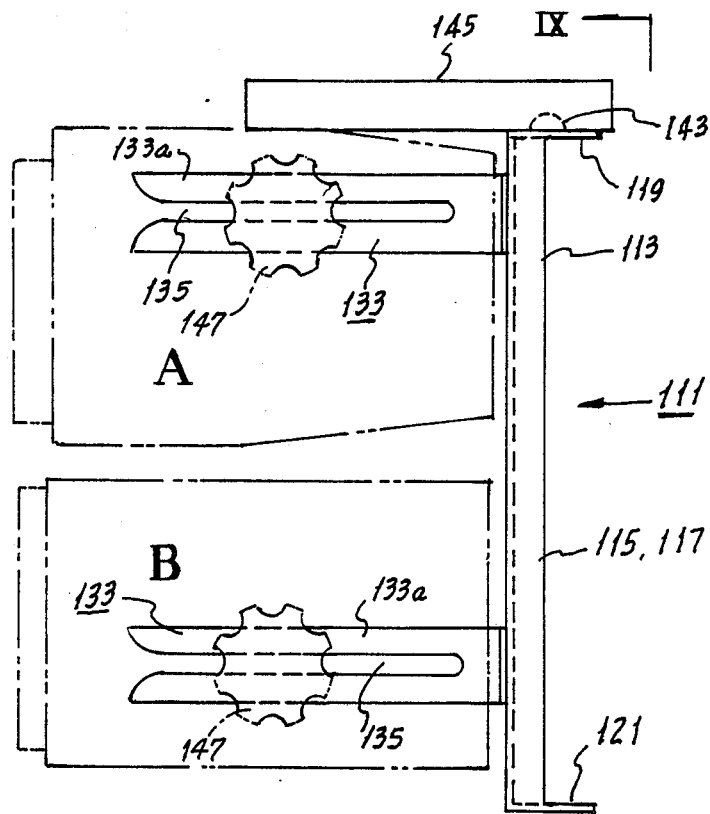
FIG. 8 is a side elevational view of a modified apparatus in accordance with the present invention.
Figure 9:
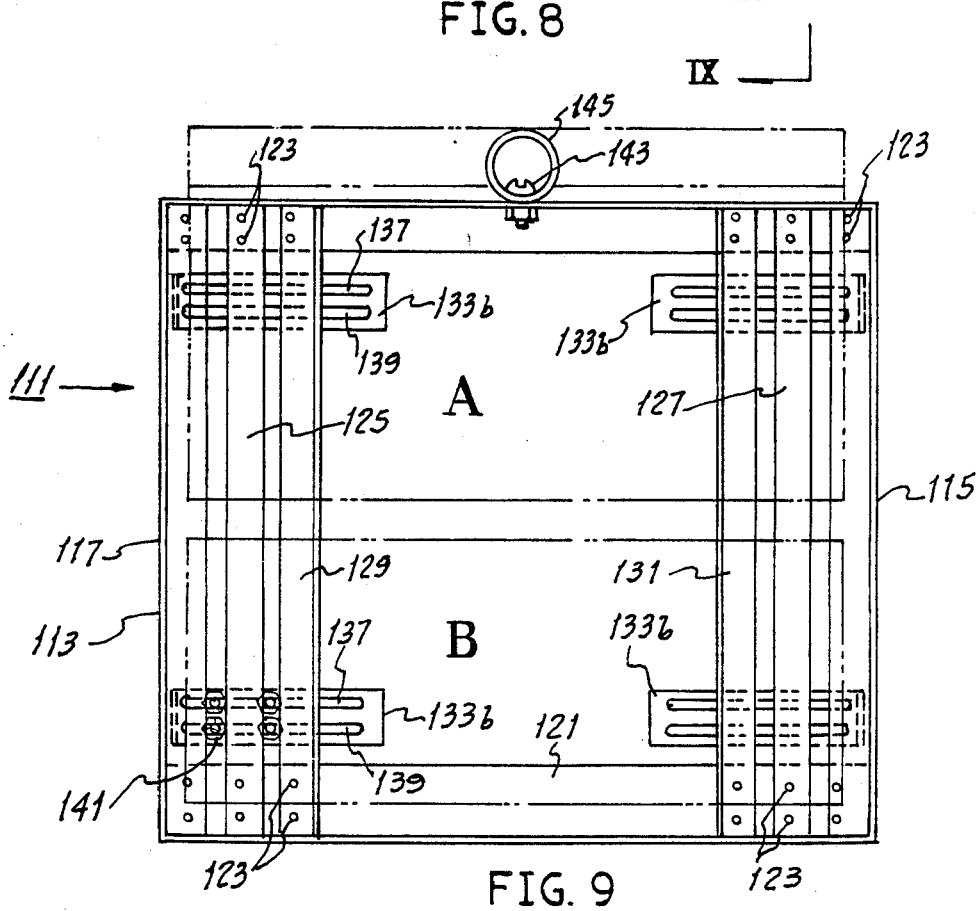
FIG. 9 is a view along line IX—IX of FIG. 8.

Referring to FIGS. 8 and 9, a modified form of rack 111 in accordance with the present invention comprises an open rectangular frame 113. The frame 113 includes vertical side angle members 115,117, and top and bottom angle members 119,121. The top 119 and the bottom 121 angle members are secured as by rivets 123, or by other suitable fasteners, to the vertical side angle members 115,117. Spaced apart from the leg of the vertical side angle members 115,117 are flat members 125,127 that are also secured by rivets 123, or other suitable fasteners, to the top and bottom angle members 119,121. Spaced apart from the flat vertical members 125,127 are other vertical angle members 129,131 that are secured to the top 119 and the bottom 121 angle members by rivets 123, or other suitable fasteners.

Removably secured to the vertical angular members 115,127,131 on one side, and the angular members 117,125,129 on the other side are hinged support members 133. Each support member 133 comprises a pair of hinged together arms shaped about as shown in FIGS. 8 and 9. That is, one arm 133a has an open ended slot 135 in it and the other arm 133b has a pair of closed ended slots 137,139. By means of suitable fasteners, such as a bolt and nut assembly 141, the support members 133 are positionable in any convenient vertical position, as well as any convenient horizontal position relative to the top rectangular frame 113.

Pivotally connected, as by a bolt and nut assembly 143, to the transverse top angle member 119 is a tubular carrying handle 145.

Referring to FIG. 8, two items of marine electronic pieces of equipment A and B are shown supported by the arms 133a of the support members 133. The pieces of equipment A,B have mounting screws 147 with large knobs that are threaded into each item of equipment, and that may be tightened to hold the equipment in place on the rack 111.

It will be recognized readily by those skilled in the art that the rack 111 may be mounted removably to a bulkhead or transom (not shown) of a boat, and it will be recognized also that the open rectangular rack affords ready access to terminals and other connection points on the back of the items A and B, so that they may receive electric current and be tied into other equipment on the boat.

Although the invention has been described herein with a certain degree of particularity, it is understood that other modifications may be made therein without departing from the scope of the present invention as defined by the following claims.

What is claimed is:

1. A support structure for equipment comprising: an open frame; a back pivotally connected at one edge to one edge of said open frame; a pair of articulated links pivotably connected at one end each to said open frame adjacent an edge opposite said one edge of said open frame and on opposite sides of said open frame; a pair of other links pivotally connected to another edge of said back opposite said one edge and releasably connected to an elongate member pivotally connected to and extending between the free ends of said articulate links; a pair of elongate links pivotally connected each at one end to said open frame on opposite sides thereof and at locations adjacent said one edge, the free end of each elongate link being releasably connectable to one of said articulated inks and to said elongate member; and means for connecting said back to another support structure in such a way that said open frame can support said equipment.

2. The structure of claim 1 wherein said open frame is comprised of interconnected angle members so arranged that said open frame has upstanding flanged peripheral edges.

3. The structure of claim 1 wherein each one of said other links has means at a free end for engaging and coacting with said elongate member.

4. The structure of claim 1 wherein each one of said elongate links has means for engaging and coacting with said articulated links when said open frame is in one operative position and for engaging and coacting with said elongate member when said open frame is in another operative position.

5. The structure of claim 1 wherein each said elongate link has a notch in one edge for coacting with one of said articulated links.

6. The structure of claim 5 wherein said notch is semi-circular in shape.

7. The structure of claim 1 including means pivotably mounted to said back for supporting a piece of said equipment.

8. The structure of claim 7 wherein said means includes a pair of arms each pivotably mounted to said back with each arm having an elongate longitudinally extending open ended slot therein.

9. The structure of claim 2 wherein opposite side flanged edges of said open frame have notches to receive the hinge portion of each pair of articulated links.

10. The structure of claim 1 wherein each one of said other links each has adjacent the free end thereof a notch that coacts with said elongate member.

11. The structure of claim 1 wherein each one of said pair of elongate links has in the free end portion a notch that coacts with one of said articulated links and with said elongate member.

* * * * *